United States Patent
Doan et al.

(10) Patent No.: US 8,378,398 B2
(45) Date of Patent: Feb. 19, 2013

(54) PHOTODETECTOR ISOLATION IN IMAGE SENSORS

(75) Inventors: Hung Q. Doan, Rochester, NY (US); Eric G. Stevens, Webster, NY (US); Robert M. Guidash, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 106 days.

(21) Appl. No.: 12/966,224

(22) Filed: Dec. 13, 2010

(65) Prior Publication Data

US 2012/0080733 A1    Apr. 5, 2012

Related U.S. Application Data

(60) Provisional application No. 61/388,013, filed on Sep. 30, 2010.

(51) Int. Cl.
*H01L 31/062* (2006.01)
*H01L 31/113* (2006.01)

(52) U.S. Cl. .................... 257/292; 257/E27.133

(58) Field of Classification Search .......... 257/292, 257/293, E29.321, E21.428, E27.133, E27.153, 257/E27.154, E29.018, E29.02, E21.54, E21.546
See application file for complete search history.

(56) References Cited

U.S. PATENT DOCUMENTS

| | | | |
|---|---|---|---|
| 8,101,450 B1 * | 1/2012 | Doan et al. ............... 438/57 |
| 2006/0033129 A1 * | 2/2006 | Mouli ..................... 257/291 |
| 2006/0255382 A1 * | 11/2006 | Rhodes .................... 257/292 |
| 2007/0087463 A1 | 4/2007 | Adkisson et al. |
| 2007/0108371 A1 * | 5/2007 | Stevens et al. .......... 250/214.1 |
| 2007/0200196 A1 * | 8/2007 | Kumar et al. ............. 257/506 |
| 2009/0075419 A1 * | 3/2009 | Kuriyama ................. 438/75 |
| 2009/0242949 A1 * | 10/2009 | Adkisson et al. ......... 257/292 |
| 2009/0243025 A1 * | 10/2009 | Stevens et al. ........... 257/461 |
| 2010/0116971 A1 * | 5/2010 | McCarten et al. ........ 250/214.1 |
| 2010/0140668 A1 * | 6/2010 | Stevens .................... 257/225 |
| 2010/0148230 A1 * | 6/2010 | Stevens et al. ........... 257/290 |
| 2010/0327392 A1 * | 12/2010 | McCarten et al. ........ 257/447 |
| 2012/0050554 A1 * | 3/2012 | Levine et al. ............. 348/216.1 |
| 2012/0080731 A1 * | 4/2012 | Doan et al. ............... 257/292 |
| 2012/0080733 A1 * | 4/2012 | Doan et al. ............... 257/292 |

OTHER PUBLICATIONS

Chung-Wei Chang et al., "High Sensitivity of Dielectric Films Structure for Advanced CMOS Image Sensor Technology", 2007 IEEE International Image Sensor Workshop.

Eric Stevens et al., "Low-Crosstalk and Low-Dark-Current CMOS Image-Sensor Technology using a Hole-Based Detector", Digest of Technical Papers, pp. 60, 61, 595, 2008 IEEE International Solid-State Circuits Conference.

Eric Stevens et al., "Low-Crosstalk and Low-Dark-Current CMOS Image-Sensor Technology using a Hole-Based Detector", 2008 IEEE International Solid-State Circuits Conference.

(Continued)

*Primary Examiner* — Matthew Landau
*Assistant Examiner* — Latanya N Crawford
(74) *Attorney, Agent, or Firm* — Blakely Sokoloff Taylor & Zafman LLP

(57) ABSTRACT

Shallow trench isolation regions are disposed in an n-type silicon semiconductor layer laterally adjacent to a collection region of a photodetector and laterally adjacent to a charge-to-voltage conversion region. The shallow trench isolation regions each include a trench disposed in the silicon semiconductor layer and a first dielectric structure disposed along an interior bottom and sidewalls of each trench. A second dielectric structure is disposed over the pinning layer. The dielectric structures include a silicon nitride layer disposed over an oxide layer. An n-type isolation layer is disposed along only a portion of the exterior bottom of the trench and the exterior sidewall of the trench immediately adjacent to the photodetector. The n-type isolation layer is not disposed along the remaining portion of the bottom or the opposing exterior sidewall of the trench.

6 Claims, 16 Drawing Sheets

OTHER PUBLICATIONS

U.S. Appl. No. 12/894,262—Non-Final Office Action, mailed Jun. 8, 2012 (11 pages).

U.S. Appl. No. 12/894,262—Restriction Requirement Office Action, mailed Mar. 20, 2012 (5 pages).

* cited by examiner

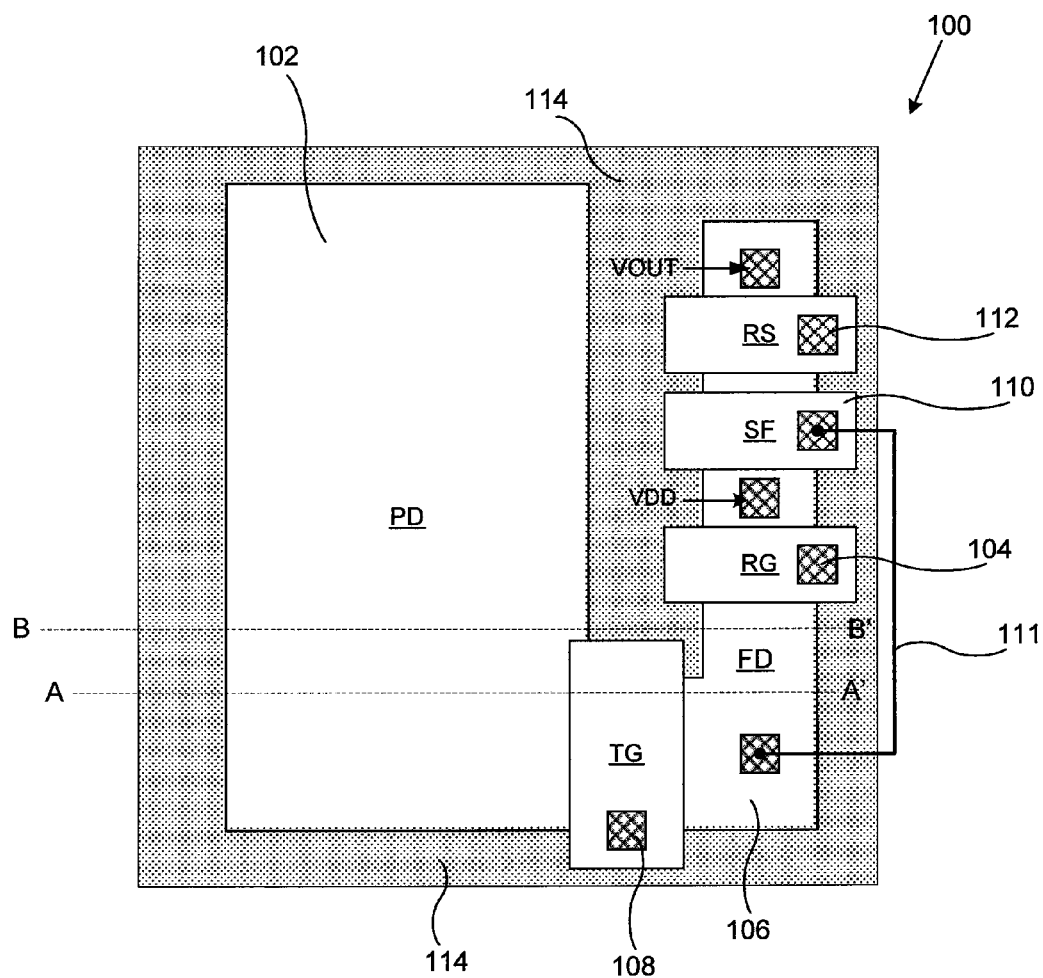
FIG. 1 - Prior Art

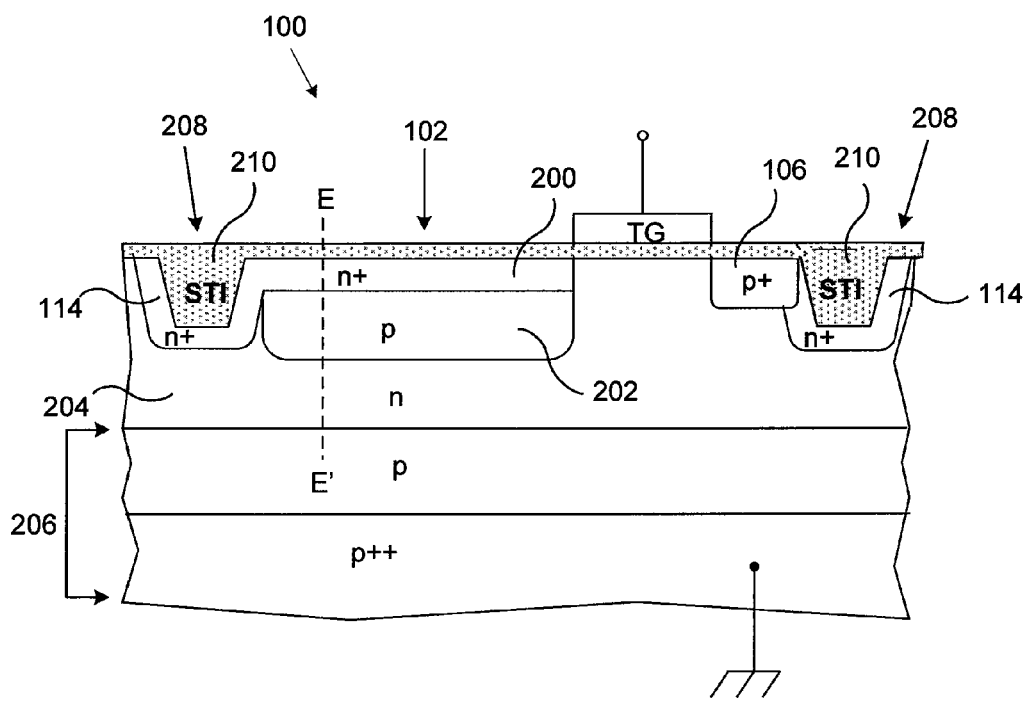
FIG. 2 - Prior Art
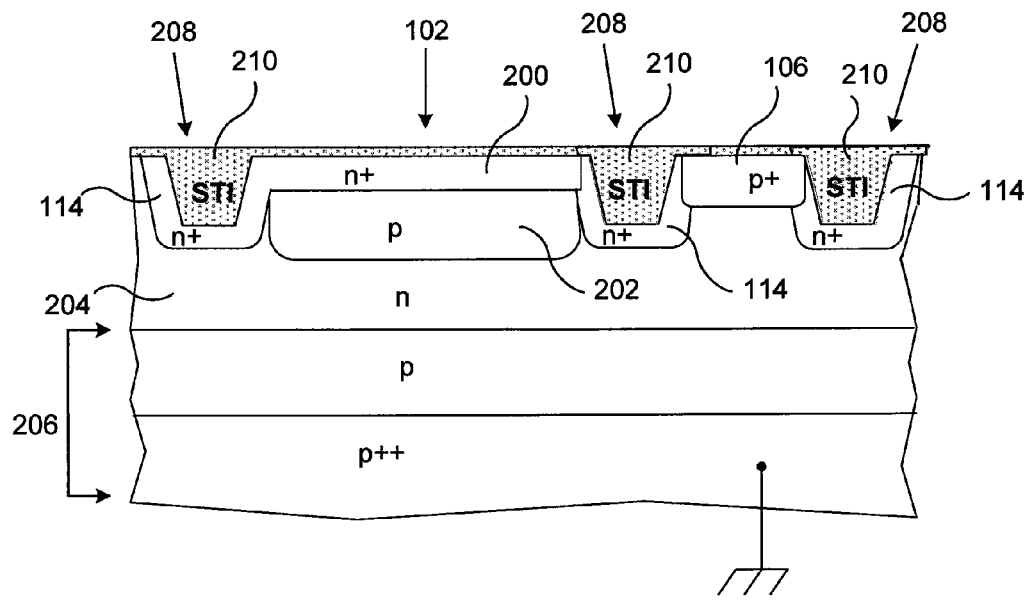
FIG. 3 - Prior Art

PHOTODETECTOR ISOLATION IN IMAGE SENSORS

CROSS-REFERENCE TO RELATED APPLICATION

This application claims the benefit of U.S. Provisional Application 61/388,013 filed on Sep. 30, 2010.

TECHNICAL FIELD

The present invention relates to image sensors for use in digital cameras and other types of image capture devices, and more particularly to Complementary Metal Oxide Semiconductors (CMOS) image sensors. Still more particularly, the present invention relates to photodiode isolation in CMOS image sensors and a method for producing such isolation.

BACKGROUND

Image sensors capture images using thousands to millions of pixels that are typically arranged in an array. FIG. 1 depicts a top view of a pixel commonly used in a CMOS image sensor in accordance with the prior art. Pixel 100 includes photodetector (PD) 102 that collects charge in response to incident light. Before the charge is read out of photodetector 102, an appropriate signal is applied to the gate (RG) of a reset transistor via contact 104 to reset a charge-to-voltage conversion region (FD) 106 to a known potential VDD. Charge is then transferred from the photodetector 102 to the charge-to-voltage conversion region 106 when a transfer transistor is enabled through the application of an appropriate signal to a transfer gate (TG) using contact 108. The charge-to-voltage conversion region 106 is used to convert the collected charge into a voltage.

A gate 110 of an amplifier transistor (SF) is connected via signal line 111 to charge-to-voltage conversion region 106. To transfer the voltage from the charge-to-voltage conversion region 106 to an output VOUT, an appropriate signal is applied to a gate of a row select transistor (RS) via contact 112. Activation of the row select transistor enables the amplifier transistor (SF), which in turn transfers the voltage from charge-to-voltage converter (FD) to VOUT. Shallow trench isolation regions (STI) surround the photodetector (PD) and the pixel 100 to electrically isolate the pixel from adjacent pixels in the image sensor. An n-type isolation layer 114 surrounds the STI regions, as will be described in more detail in conjunction with FIGS. 2 and 3.

FIG. 2 illustrates a cross-sectional schematic view along line A-A in FIG. 1 depicting the prior art pixel structure. Pixel 100 includes the transfer gate (TG), charge-to-voltage conversion region 106, and photodetector 102. The photodetector 102 is implemented as a pinned photodiode consisting of n+ pinning layer 200 and p-type storage region 202 formed within n-type layer 204. N-type layer 204 is disposed over substrate layer 206.

Shallow trench isolation regions (STI) 208 are formed laterally adjacent to opposite sides of photodetector 102 and surround the photodetector. STI 208 is also formed laterally adjacent to the charge-to-voltage conversion region 106, with the transfer gate (TG) positioned between photodetector 102 and charge-to-voltage conversion region 106. STI regions 208 include a trench formed in the n-type layer 204 that is filled with a dielectric material 210. The n-type isolation layer 114 surrounds the sidewalls and bottom of each trench. Isolation layer 114 is typically formed by implanting an n-type dopant into the sidewalls and bottoms of the trenches prior to filling the trenches with the dielectric material 210.

FIG. 3 depicts a cross-sectional schematic view along line B-B in FIG. 1 depicting the prior art pixel structure. STI regions 208 are formed laterally adjacent to and surrounding photodetector 102. STI region 208 is also formed laterally adjacent to charge-to-voltage conversion region 106. N-type isolation layer 114 surrounds the sidewalls and bottom of the trenches.

The shallow n+ implant of isolation layer 114 can cause the peripheral capacitance of the charge-to-voltage conversion region 106 to increase, and can cause higher dark current or point defects due to the p+/n+ diode junction formed by the n-type isolation layer and the p-type charge-to-voltage conversion region 106. In addition the n-type isolation layer 114 that is laterally adjacent to the one or more transistors in pixel 100, such as the amplifier transistor (SF), can reduce the effective width of the transistors. This can cause narrow channel effects and require the design of a wider transistor that in turn reduces the fill factor of the pixel.

SUMMARY

An image sensor includes an array of pixels that form an imaging area. At least one pixel includes a photodetector and a charge-to-voltage conversion region disposed in a silicon semiconductor layer. The photodetector includes a storage region having a p conductivity type that is disposed in an n-type silicon semiconductor layer. The charge-to-voltage conversion region has a p conductivity type and can be electrically connected to the storage region by a transfer gate positioned between the storage region and the charge-to-voltage conversion region.

Shallow trench isolation regions can be formed laterally adjacent to or around the photodetector, the charge-to-voltage conversion region, and other features and components in the pixels. The shallow trench isolation regions each include a trench disposed in the silicon semiconductor layer that is lined with a dielectric structure and filled with a dielectric material. One shallow trench isolation region is laterally adjacent to and surrounds each photodetector. The shallow trench isolation region includes a dielectric structure disposed along an interior bottom and sidewalls of the trench. The dielectric structure includes a silicon nitride layer disposed over an oxide liner layer.

An isolation layer having the n conductivity type is disposed along only a portion of an exterior bottom and along an exterior sidewall of the trench that is immediately adjacent to a photodetector. The isolation layer is not disposed along the remaining exterior bottom portion and the opposing exterior sidewall of the trench.

Another shallow trench isolation region can be formed laterally adjacent to or surrounding the other electrical components in each pixel. The other electrical components can include a charge-to-voltage conversion region and source/drain implant regions for one or more transistors. The shallow trench isolation region includes a dielectric structure disposed along an interior bottom and sidewalls of the trench. The dielectric structure includes a silicon nitride layer disposed over a gate oxide layer. An isolation layer is not disposed along the exterior bottom and sidewalls of the trenches adjacent to the other electrical components in the pixels.

BRIEF DESCRIPTION OF THE DRAWINGS

Embodiments of the invention are better understood with reference to the following drawings. The elements of the drawings are not necessarily to scale relative to each other.

FIG. 1 depicts a top view of a pixel commonly used in a CMOS image sensor in accordance with the prior art;

FIG. 2 illustrates a cross-sectional view along line A-A' in FIG. 1 depicting the prior art pixel structure;

FIG. 3 depicts a cross-sectional view along line B-B' in FIG. 1 depicting the prior art pixel structure;

DETAILED DESCRIPTION

Figure 4:
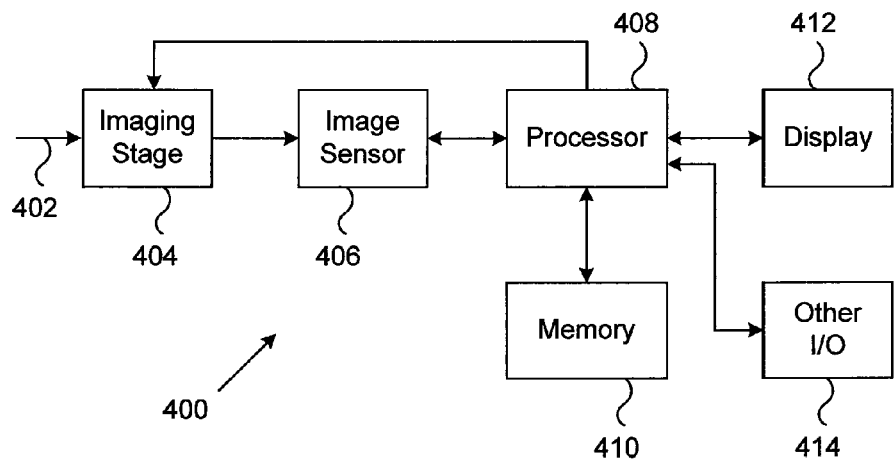
FIG. 4 is a simplified block diagram of an image capture device in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, charge, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate layer" is to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

Referring to the drawings, like numbers indicate like parts throughout the views.

FIG. 4 is a simplified block diagram of an image capture device in an embodiment in accordance with the invention. Image capture device 400 is implemented as a digital camera in FIG. 4. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 400, light 402 from a subject scene is input to an imaging stage 404. Imaging stage 404 can include conventional elements such as a lens, a neutral density filter, an iris and a shutter. Light 402 is focused by imaging stage 404 to form an image on image sensor 406. Image sensor 406 captures one or more images by converting the incident light into electrical signals. Digital camera 400 further includes processor 408, memory 410, display 412, and one or more additional input/output (I/O) elements 414. Although shown as separate elements in the embodiment of FIG. 4, imaging stage 404 may be integrated with image sensor 406, and possibly one or more additional elements of digital camera 400, to form a compact camera module.

Processor 408 may be implemented, for example, as a microprocessor, a central processing unit (CPU), an application-specific integrated circuit (ASIC), a digital signal processor (DSP), or other processing device, or combinations of multiple such devices. Various elements of imaging stage 404 and image sensor 406 may be controlled by timing signals or other signals supplied from processor 408.

Memory 410 may be configured as any type of memory, such as, for example, random access memory (RAM), read-only memory (ROM), Flash memory, disk-based memory, removable memory, or other types of storage elements, in any combination. A given image captured by image sensor 406 may be stored by processor 408 in memory 410 and presented on display 412. Display 412 is typically an active matrix color liquid crystal display (LCD), although other types of displays may be used. The additional I/O elements 414 may include, for example, various on-screen controls, buttons or other user interfaces, network interfaces, or memory card interfaces.

It is to be appreciated that the digital camera shown in FIG. 4 may comprise additional or alternative elements of a type known to those skilled in the art. Elements not specifically shown or described herein may be selected from those known in the art. As noted previously, the present invention may be implemented in a wide variety of image capture devices.

Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 5:
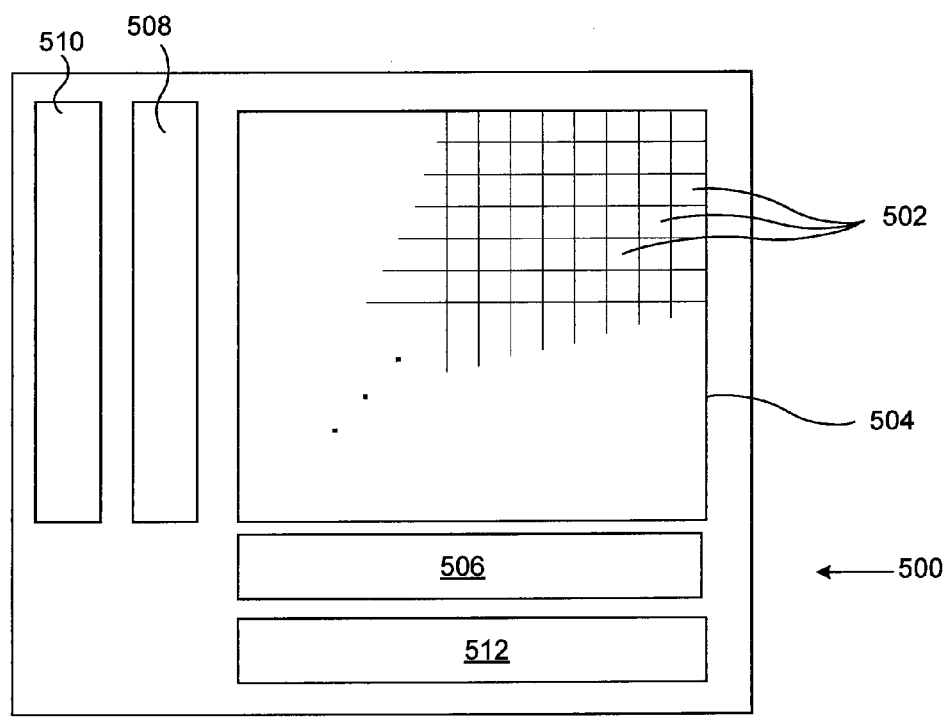
FIG. 5 is a simplified block diagram of an image sensor suitable for use as image sensor 406 shown in FIG. 4 in an embodiment in accordance with the invention.

Referring now to FIG. 5, there is shown a simplified block diagram of an image sensor suitable for use as image sensor 406 shown in FIG. 4 in an embodiment in accordance with the invention. Image sensor 500 typically includes an array of pixels 502 that form an imaging area 504. Image sensor 500 further includes column decoder 506, row decoder 508, digital logic 510, and analog or digital output circuits 512. Image sensor 500 is implemented as a back or front-illuminated Complementary Metal Oxide Semiconductor (CMOS) image sensor in an embodiment in accordance with the invention. Thus, column decoder 506, row decoder 508, digital logic 510, and analog or digital output circuits 512 are implemented as standard CMOS electronic circuits that are electrically connected to imaging area 504.

Functionality associated with the sampling and readout of imaging area 504 and the processing of corresponding image data may be implemented at least in part in the form of software that is stored in memory 410 and executed by processor 408 (see FIG. 4). Portions of the sampling and readout circuitry may be arranged external to image sensor 406, or formed integrally with imaging area 504, for example, on a common integrated circuit with photodetectors and other elements of the imaging area. Those skilled in the art will recognize that other peripheral circuitry configurations or architectures can be implemented in other embodiments in accordance with the invention.

Figure 6:
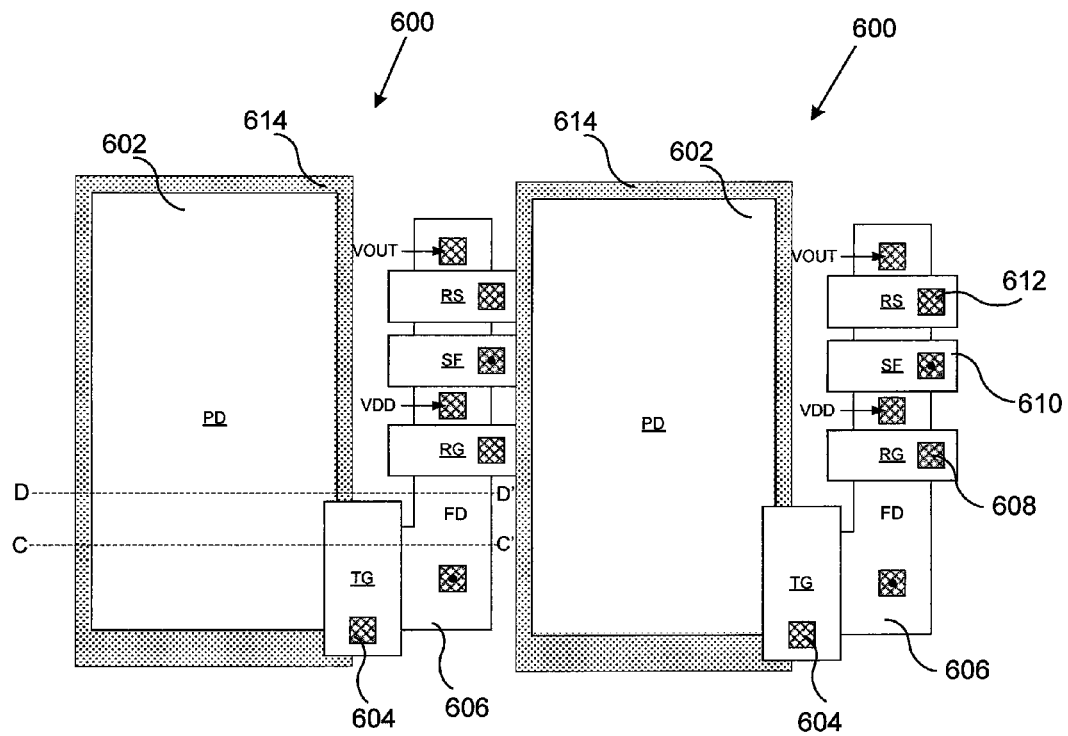
FIG. 6 illustrates a top view of two exemplary pixels each suitable for use as pixel 502 shown in FIG. 5 in an embodiment in accordance with the invention.

FIG. 6 illustrates a top view of two exemplary adjacent pixels suitable for use as pixels 502 shown in FIG. 5 in an embodiment in accordance with the invention. Pixels 600 each include a photodetector (PD) 602, transfer transistor with transfer gate (TG) and contact 604, charge-to-voltage conversion region (FD) 606, reset transistor with reset gate (RG) 608, amplifier transistor (SF) with gate 610, row select transistor with gate and contact 612, VDD, and VOUT. The signal line (e.g., line 111 in FIG. 1) connecting charge-to-voltage conversion region 606 to gate 610 of amplifier transistor (SF) is omitted in FIG. 6 for simplicity. Amplifier transistor (SF) is implemented as a source-follower transistor and charge-to-voltage conversion region as a floating diffusion in an embodiment in accordance with the invention.

The transfer transistor, charge-to-voltage conversion region 606, reset transistor, row select transistor, amplifier transistor, VDD, and VOUT are examples of electrical components that can be included in a pixel 600. Other embodiments in accordance with the invention can omit one or more of the illustrated electrical components. Alternatively, a pixel can include fewer, additional or different types of electrical components.

Charge collection and readout from pixels 600 is the same as that described with reference to FIG. 1. The shallow trench isolation regions (STI) surround photodetectors 602 and other electrical components as in the prior art, but the n-type isolation layer 614 surrounds only exterior portions of the STI regions immediately adjacent the photodetectors 602, as will be described in more detail in conjunction with FIGS. 7 and 8.

Figure 7:
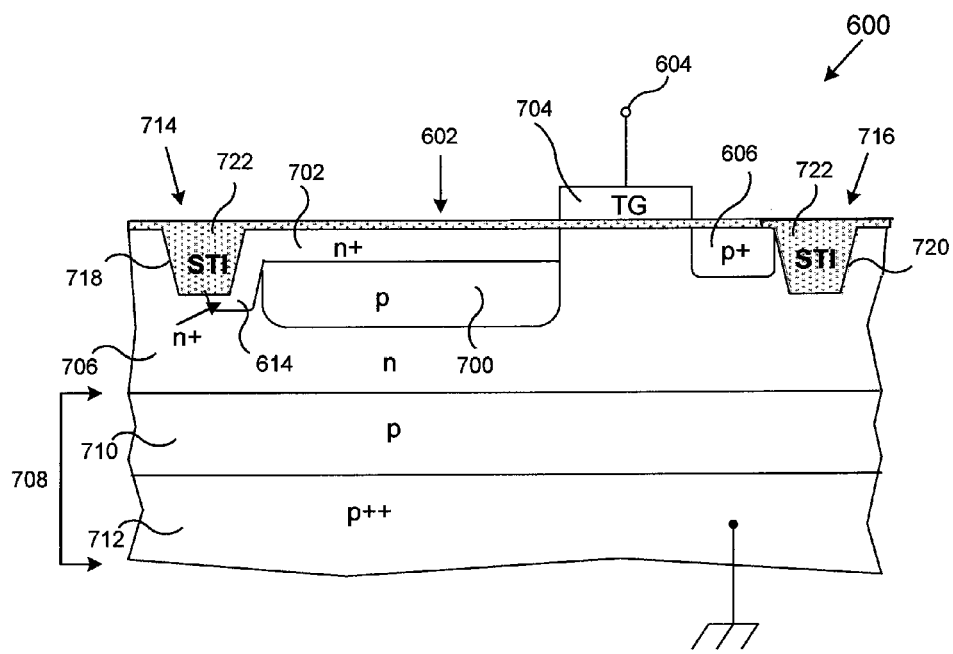
FIG. 7 depicts a cross-sectional view along line C-C' in FIG. 6.

FIG. 7 depicts a cross-sectional view along line C-C in FIG. 6. Pixel 600 includes storage region 700 and pinning layer 702 that together form photodetector 602 in an embodiment in accordance with the invention. In the illustrated embodiment, storage region 700 is doped with one or more dopants having a p conductivity type while pinning layer 702 is doped with a dopant or dopants having an n conductivity type.

Pixel 600 further includes transfer gate 704 disposed between photodetector 602 and charge-to-voltage conversion region 606. Charge collected in storage region 700 transfers to charge-to-voltage conversion region 606 when an appropriate signal is applied to contact 604.

Photodetector 602 and charge-to-voltage conversion region 606 are disposed in silicon semiconductor layer 706. Silicon semiconductor layer 706 has an n conductivity type and may be implemented as a layer that spans an imaging area (e.g., imaging area 504) or as a well. Silicon semiconductor layer 706 is disposed over substrate layer 708. Silicon semiconductor layer 706 can be implemented as a uninterrupted continuous layer that spans an imaging area (e.g., imaging area 504 in FIG. 5) in an embodiment in accordance with the invention. In another embodiment, semiconductor layer 706 can be implemented as a patterned layer. By way of example only, semiconductor layer 706 can be patterned such that layer 706 is not disposed under at least a portion of storage region 700.

Substrate layer 708 is implemented as an epitaxial layer 710 disposed over a substrate 712 in the FIG. 7 embodiment. Both epitaxial layer 710 and substrate 712 have a p conductivity type in an embodiment in accordance with the invention. Substrate 712 can be implemented as a bulk substrate having an n conductivity type in another embodiment in accordance with the invention.

Shallow trench isolation regions (STI) 714, 716 are disposed in silicon semiconductor layer 706. Each STI region 714, 716 includes a respective trench 718, 720 that is filled with a dielectric material 722. Isolation layer 614 having an n conductivity type only partially surrounds the STI region 714 that is immediately adjacent to and surrounds the photodetector 602. Isolation layer 614 is disposed along an exterior portion of a bottom of trench 718 and along only one exterior sidewall of trench 718. In particular, isolation layer 614 is disposed along the exterior portion of the bottom and the exterior sidewall of trench 718 that is immediately adjacent to storage region 700 and pinning layer 702.

Forming isolation layer 614 only along only an exterior portion of the bottom and along the exterior sidewall of trench 718 immediately adjacent to photodetector 602 suppresses dark current of the STI sidewall or interface that is immediately adjacent to the photodetector. Additionally, isolation layer 614 is not disposed along the remaining exterior bottom portion and other exterior sidewall of trench 718, and not along the exterior sidewalls and bottom of trench 720 of STI region 716. Because isolation layer 614 is missing from these regions, the capacitance of charge-to-voltage conversion region 606 and the characteristics of the other transistors (e.g., reset transistor, source follower transistor, row select transistor) in pixel 600 are not adversely affected by isolation layer 614. Another advantage of removing the n+ isolation layer 614 from the exterior sidewalls and bottom of trench 720 is the increase in the field effect transistor (FET) effective width. As a result, the FET width can be physically smaller, which allows the width of photodetector 602 to be bigger, thereby increasing pixel fill factor.

Figure 8:
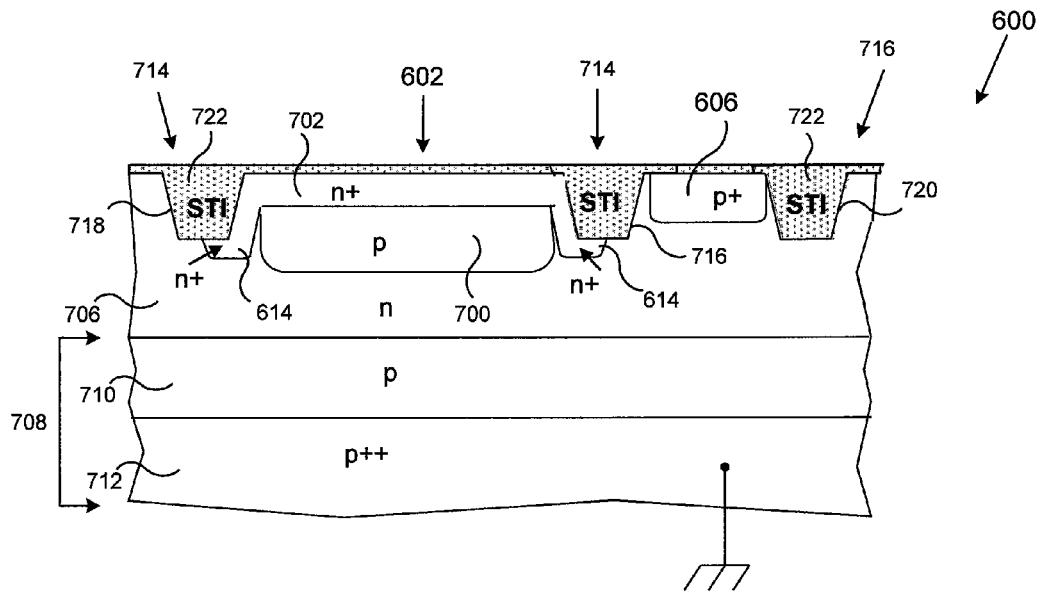
FIG. 8 illustrates a cross-sectional view along line D-D' in FIG. 6.

Referring now to FIG. 8, there is shown a cross-sectional view along line D-D in FIG. 6. Shallow trench isolation regions 714, 716 are disposed in silicon semiconductor layer 706. STI region 714 includes isolation layer 614 having an n conductivity type. Isolation layer 614 only partially surrounds the STI region 714. Isolation layer 614 is disposed along the exterior portion of the bottom and the exterior sidewall of trench 718 that is immediately adjacent to storage region 700 and pinning layer 702 of photodetector 602.

Isolation layer 614 is not disposed along the other exterior portion of the bottom and the other exterior sidewall of trench 718 that is not immediately adjacent to photodetector 602. Isolation layer 614 is also not disposed along the exterior sidewalls and bottom of trench 720 of STI region 716.

Figure 9:
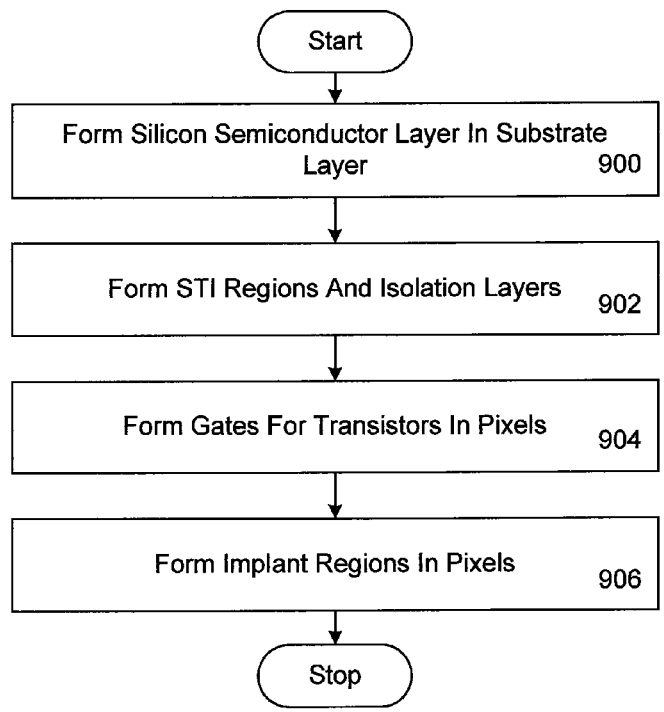
FIG. 9 is a flowchart of a method for fabricating a portion of a pixel included in an image sensor in an embodiment in accordance with the invention.

FIG. 9 is a flowchart of a method for fabricating a portion of a pixel included in an image sensor in an embodiment in accordance with the invention. Initially, silicon semiconductor layer 706 is formed over substrate layer 708 (block 900). Silicon semiconductor layer 706 is formed over an epitaxial layer (e.g., epitaxial layer 710) when the substrate layer includes an epitaxial layer disposed over a substrate.

Next, as shown in block 902, STI regions 714, 716 and isolation layer 614 are formed in silicon semiconductor layer 706. A process for producing STI regions 714, 716 and isolation layer 616 is described in more detail in conjunction with FIGS. 10 and 11.

The gates for the transistors in the pixels are then formed, as shown in block 904. The gates can include the transfer gate (TG), the reset gate (RG), a gate of an amplifier transistor, and a gate of a row select transistor in an embodiment in accordance with the invention.

Next, as shown in block 906, the implant regions are formed. The implant regions include the storage region 700, charge-to-voltage conversion region 606, other source/drain regions, and the pinning layer 702 in an embodiment in accordance with the invention.

Those skilled in the art will recognize that other features and components of a pixel or imaging area are produced before, simultaneously with, or after the processes illustrated in FIG. 9. Moreover, features and components outside of the imaging area (e.g., area 504 in FIG. 5) can be fabricated before, simultaneously with, or after the processes illustrated in FIG. 9.

FIGS. 10A-10D depict a method for producing the STI regions 714, 716 and isolation layer 614 shown in FIG. 7 in an embodiment in accordance with the invention. The processes shown in FIGS. 10A-10D are not meant to illustrate all of the fabrication techniques for an image sensor or for a pixel. Those skilled in the art will recognize that other processes may be implemented prior to, in between, and subsequent to the procedures shown in FIGS. 10A-10D.

Figure 10A:
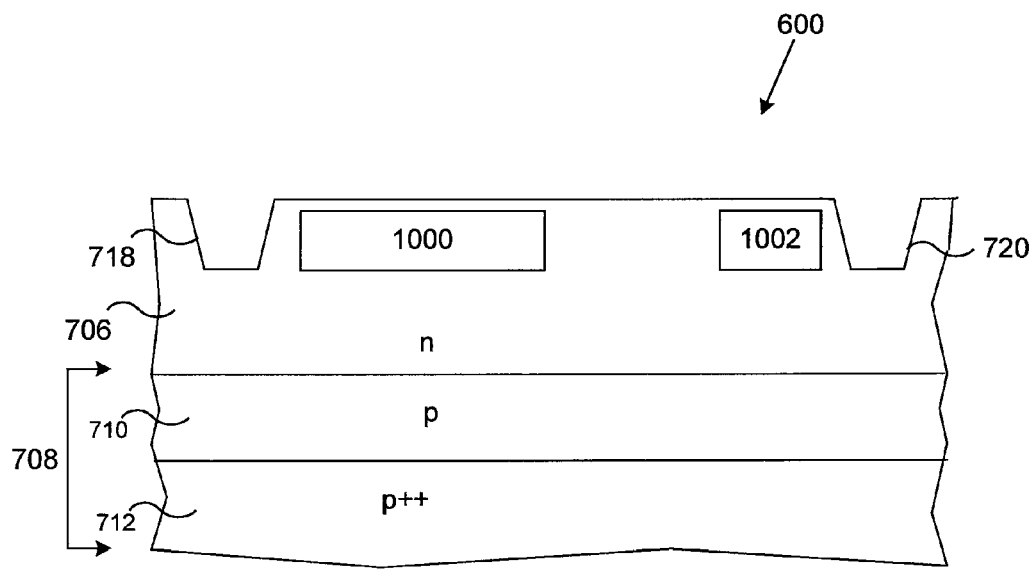
FIGS. 10A-10D depict a method for producing the STI regions 714, 716 and isolation layer 614 shown in FIG. 7 in an embodiment in accordance with the invention.

FIG. 10A illustrates the pixel after n-type silicon semiconductor layer 706 is formed in or over p-type epitaxial layer 710 and after trenches 718, 720 are formed in layer 706. N-type silicon semiconductor layer 706 is produced by implanting a dopant having an n conductivity type into epitaxial layer 710 in an embodiment in accordance with the invention. Trenches 718, 720 can be formed by etching the n-type layer 706 using techniques known in the art.

Box 1000 represents an area in silicon semiconductor layer 706 where a photodetector will subsequently be formed. Box 1002 represents an area in silicon semiconductor layer 706 where a charge-to-voltage conversion region will subsequently be formed. As shown in FIG. 9, the photodetectors and other implanted regions, such as charge-to-voltage conversion and source/drain implant regions, are typically formed after the STI regions and gates have been formed.

Figure 10B:
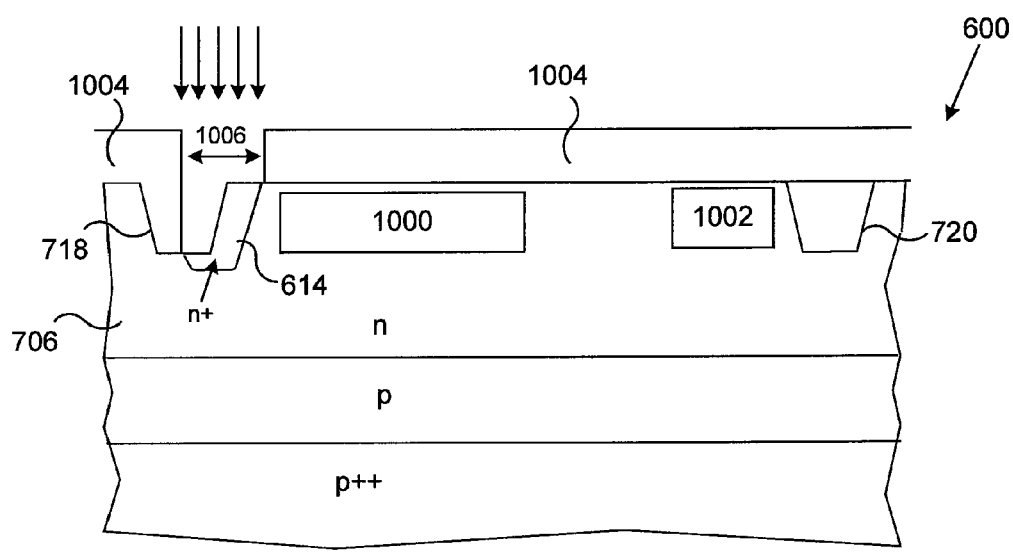

A masking layer 1004 is then formed over pixel 600 and patterned to produce opening 1006 (FIG. 10B). Opening 1006 exposes a portion of trench 718 and n-type silicon semiconductor layer 706. The portion of the bottom of trench 718 and the sidewall of trench 718 exposed in openings 1006 are the portions of the trench 718 that are immediately adjacent to the yet-to-be-formed PD (represented by box 1000).

An n-type dopant is implanted into opening 1006, as represented by the arrows. The n-type dopant typically has a high concentration of dopants. The implanted dopants form n-type isolation layer 614 along an exterior portion of the bottom of trench 718 and the exterior sidewall of trench 718 immediately adjacent to box 1000. The implant is performed after a liner oxidation process that produces a layer of oxide along the interior sidewalls and bottom surfaces of trench 718 in an embodiment in accordance with the invention. In another embodiment in accordance with the invention, the implant is performed prior to the liner oxidation process.

Figure 10C:
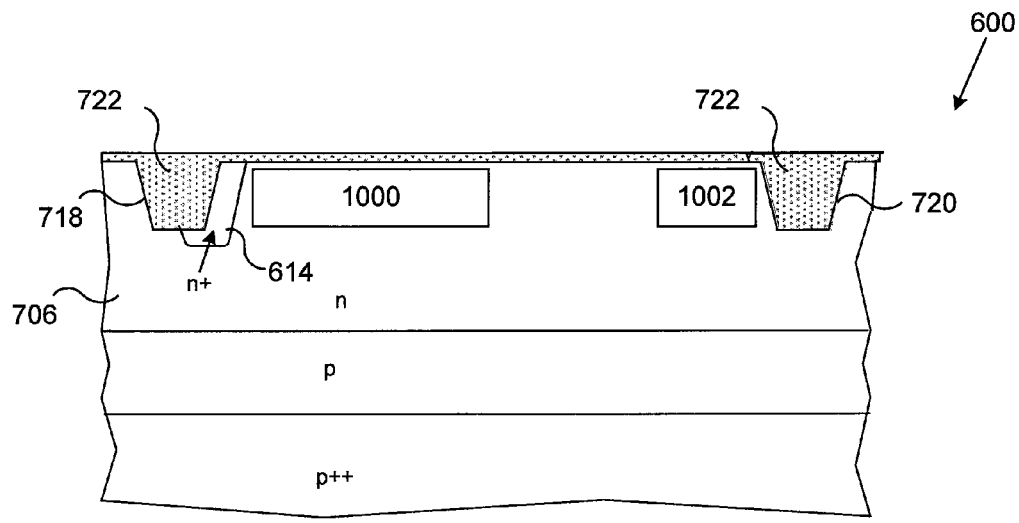

The masking layer 1004 is then removed and a dielectric material 722 formed over the surface of n-type silicon semiconductor layer 706. Dielectric material 722 fills trenches 718, 720. The dielectric material 722 is removed from the surface of silicon semiconductor layer 706 until the dielectric material 722 only fills trenches 718, 720. The upper surface of dielectric material 722 is substantially planar with the upper surface of silicon semiconductor layer 706. These processes are illustrated in FIG. 10C.

Figure 10D:
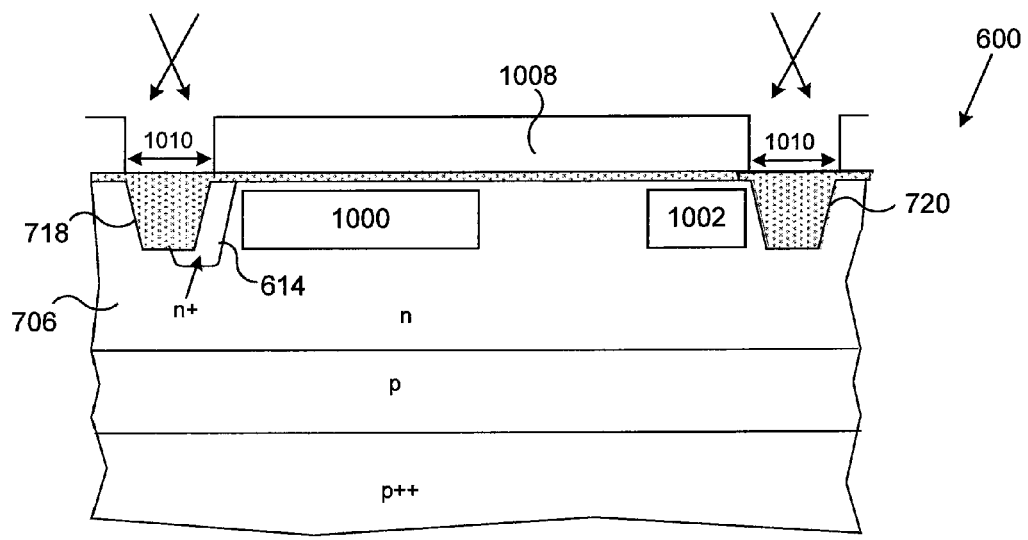

A masking layer 1008 is then formed over pixel 600 and patterned to produce openings 1010 (FIG. 10D). An n-type dopant is implanted into openings 1010, as represented by the arrows. The n-type dopant typically has a lower concentration of dopants than the dopants implanted in FIG. 10B. The implanted dopants passivate the interface between the sidewall surfaces and the n-type silicon semiconductor layer 706 and n-type isolation layer 614. The implanted dopants electrically isolate the pixels or photodetectors from one another. The implanted dopants are also used to form the well for the FETs. The process depicted in FIG. 10D is optional and is not performed in other embodiments in accordance with the invention.

Figure 11A:
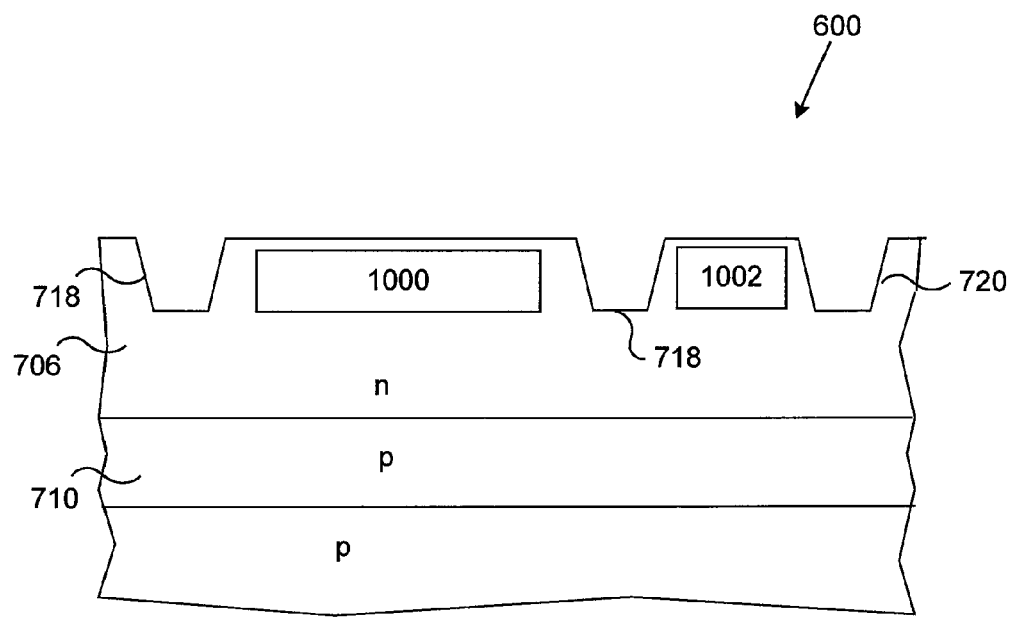
FIGS. 11A-11B depict a method for producing the STI regions 714, 716 and isolation layer 614 shown in FIG. 8 in an embodiment in accordance with the invention.
Figure 11B:
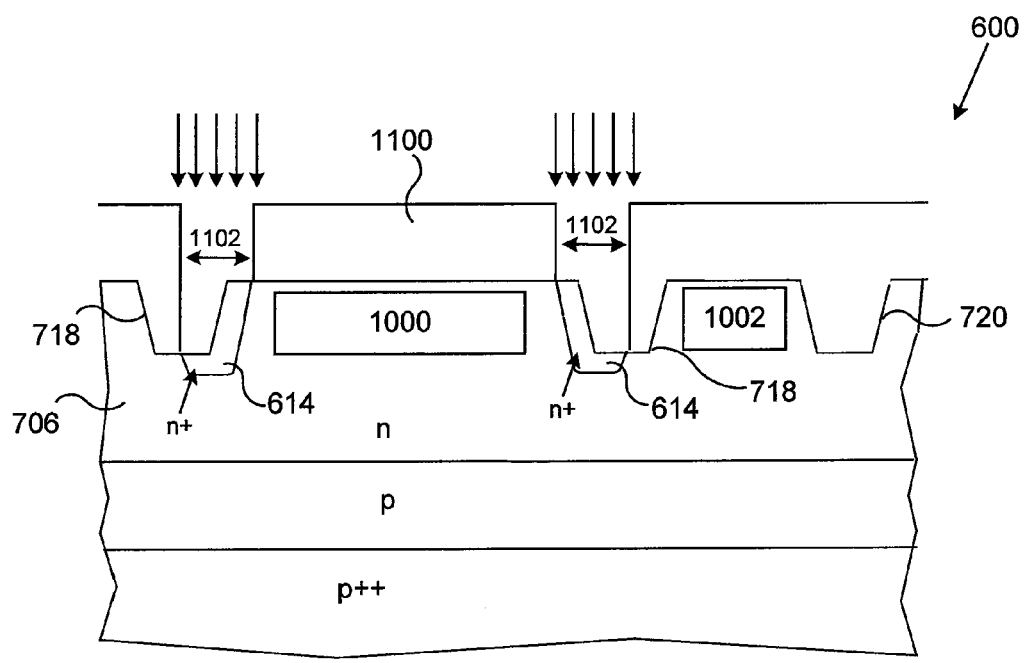

Referring now to FIGS. 11A-11B, there is shown a method for producing the STI regions 714, 716 and isolation layer 614 shown in FIG. 8 in an embodiment in accordance with the invention. FIG. 11A depicts the pixel after n-type silicon semiconductor layer 706 is formed in or over p-type epitaxial layer 710 and after trenches 718, 720 are formed in layer 706.

A masking layer 1100 is then formed over pixel 600 and patterned to produce openings 1102 (FIG. 11B). Openings 1102 expose only portions of trench 718 and n-type silicon semiconductor layer 706. The portion of the bottom of trench 718 and the sidewall of trench 718 exposed in openings 1102 are the portions of the trench 718 that are immediately adjacent to the yet-to-be-formed PD (represented by box 1000). An opening is not formed for trench 720 and trench 720 remains covered by masking layer 1100.

An n-type dopant is then implanted into silicon semiconductor layer 706 through openings 1102, as represented by the arrows. The n-type dopant typically has a high concentration of dopants. The implanted dopants form n-type isolation layer 614 along only the exterior portion of the bottom of trench 718 and the one exterior sidewall of the trench 718. Isolation layer 614 is formed in silicon semiconductor layer 706 immediately adjacent to the area where the photodetector will be formed. The implant is performed after a liner oxidation process that produces a layer of oxide along the interior sidewalls and bottom surfaces of trench 718 in an embodiment in accordance with the invention. In another embodiment in accordance with the invention, the implant is performed prior to the liner oxidation process.

The dopants are not implanted into the other exterior portion of trench 718 and into the exterior sidewalls and bottom of trench 720 because the other portion of trench 718 and trench 720 are covered by masking layer 1100. Thus, an n-type isolation layer 614 is not formed along the remaining exterior portion of the bottom of trench 718, the exterior sidewall of trench 718 not immediately adjacent to the area where the photodetector will be formed, and not along the exterior sidewalls and bottom of trench 720.

As previously described, the dopants that form isolation layer 614 are typically implanted into the trenches before the dielectric layer is disposed in the trenches. Generally, the isolation layer implant is performed only in the imaging area of the image sensor (e.g., imaging area 504 in FIG. 5). Prior art implants in the imaging area were an un-patterned or unmasked implant, meaning all of the STI regions in the imaging area received the isolation layer implant. A patterned masking layer was used to cover only the areas outside of the imaging area during the prior art isolation layer implant. Thus, the present invention does not increase fabrication costs by using a masking layer (layer 1004 in FIG. 10B; layer 1100 in FIG. 11) in the imaging area because the masking layer can be formed with the same masking layer as the prior art masking layer that was used to cover the areas outside of the imaging area.

Figure 12:
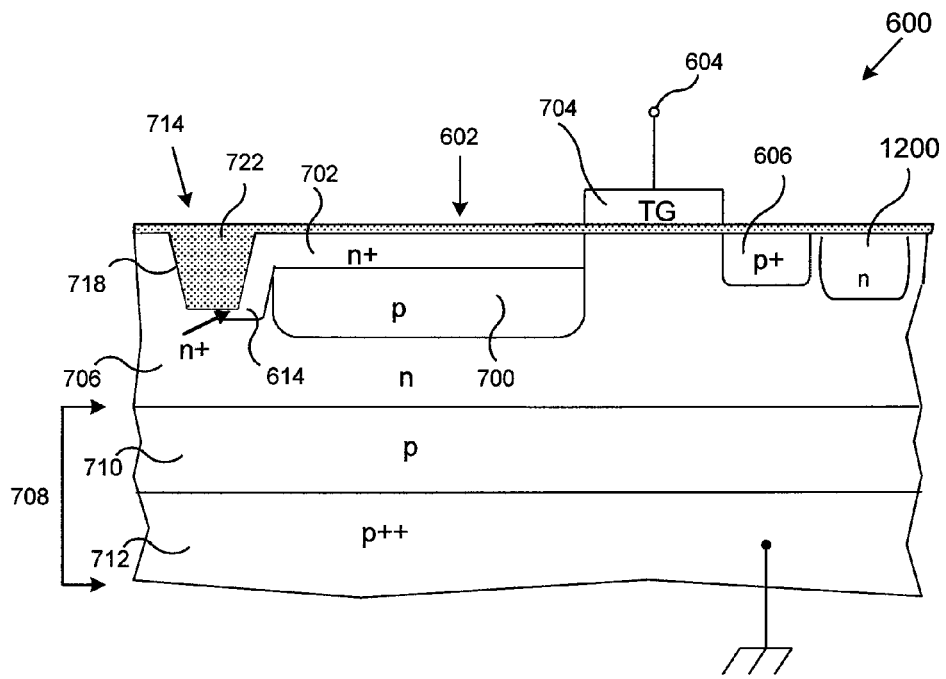
FIG. 12 is a cross-section view of a second pixel structure in an embodiment in accordance with the invention.

FIG. 12 is a cross-section view of a second pixel structure in an embodiment in accordance with the invention. The pixel structure shown in FIG. 12 is the same as the pixel structure depicted in FIG. 7, except for the use of a well 1200 instead of an STI region. Well 1200 is doped with one or more dopants having an n conductivity type in the illustrated embodiment. Well 1200 is disposed in silicon semiconductor layer 706 laterally adjacent to charge-to-voltage conversion region 606 (on the side opposite transfer gate 704). Well 1200 is used to isolate charge-to-voltage conversion region 606 from other charge-to-voltage conversion regions and components in adjacent pixels. The n+ isolation layer 614 does not reside around well 1200. Other embodiments in accordance with the invention can form the well such that it surrounds charge-to-voltage conversion region 606.

Figure 13:
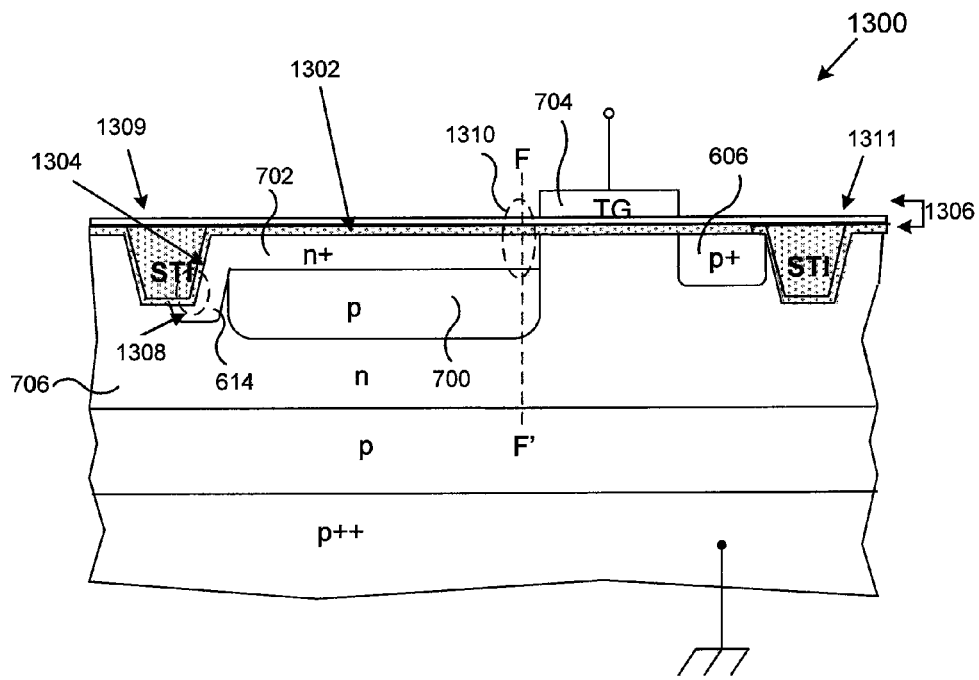
FIG. 13 depicts a cross-sectional schematic view of a third pixel structure in an embodiment in accordance with the invention.

FIG. 13 depicts a cross-sectional schematic view of a third pixel structure in an embodiment in accordance with the invention. Pixel 1300 is similar to pixel 600 shown in FIG. 7 but with the addition of fixed positive charge in several silicon-silicon dioxide interfaces. In this pixel structure, the dielectric structures above and adjacent to the n-type silicon interfaces 1302, 1304 have been modified to have large fixed positive charge. This large fixed positive charge produces accumulation at the n-type surface region and provides surface passivation at a lower n-type doping level. Specific examples of dielectric structures that produce a large positive fixed charge are an oxide-nitride-oxide (ONO) or oxide-nitride (ON) structure.

In the embodiment illustrated in FIG. 13, a dielectric structure 1306 is disposed over the silicon interface of n-type pinning layer 702 and charge-to-voltage conversion region 606. Another dielectric structure (included in circle 1308) is disposed on the bottom and sidewalls of STI region 1309 at the interface between the dielectric structure and the n-type isolation layer 614. The dielectric structure is also formed in STI region 1311 at the interface between the dielectric structure and the n-type silicon semiconductor layer 706 in an embodiment in accordance with the invention.

Dielectric structure 1306 can extend under transfer gate 704 in the embodiment shown in FIG. 13. This will be described in more detail in conjunction with FIGS. 14 and 18. The dielectric structure 1306 does not have to extend under transfer gate 704 in other embodiments in accordance with the invention.

The pixel structure illustrated in FIG. 13 is a p-type Metal Oxide Semiconductor (pMOS) pixel. A pMOS pixel forms metal-oxide-semiconductor field effect transistors (MOS-FETs) using p-type doped or implanted regions. Another pixel structure is an nMOS pixel, which forms metal-oxide-semiconductor field effect transistors (MOSFETs) using n-type doped or implanted regions. Thus, in an nMOS pixel, the pinning layer 702, silicon semiconductor layer 706, and other regions in the image sensor are formed with a p-type dopant. Because most of the surfaces associated with an nMOS pixel are p-type, image sensor designers have previously focused on reducing or eliminating the fixed positive charge associated with the dielectric layers disposed directly above and adjacent to the silicon surfaces. Removing the fixed positive charge prevents the depletion of the p-type layers (e.g., layers 702, 706) at the silicon-silicon dioxide interface, thereby reducing surface generation component of dark current.

The present invention utilizes pMOS pixels, which means most of the surfaces associated with the pixel are n-type. The structure illustrated in FIG. 13 includes dielectric structures that are optimized to enhance the effect of the fixed positive charge on the surfaces of the pixel. This enhancement is described in more detail in conjunction with FIGS. 14, 15, and 17.

Figure 14:
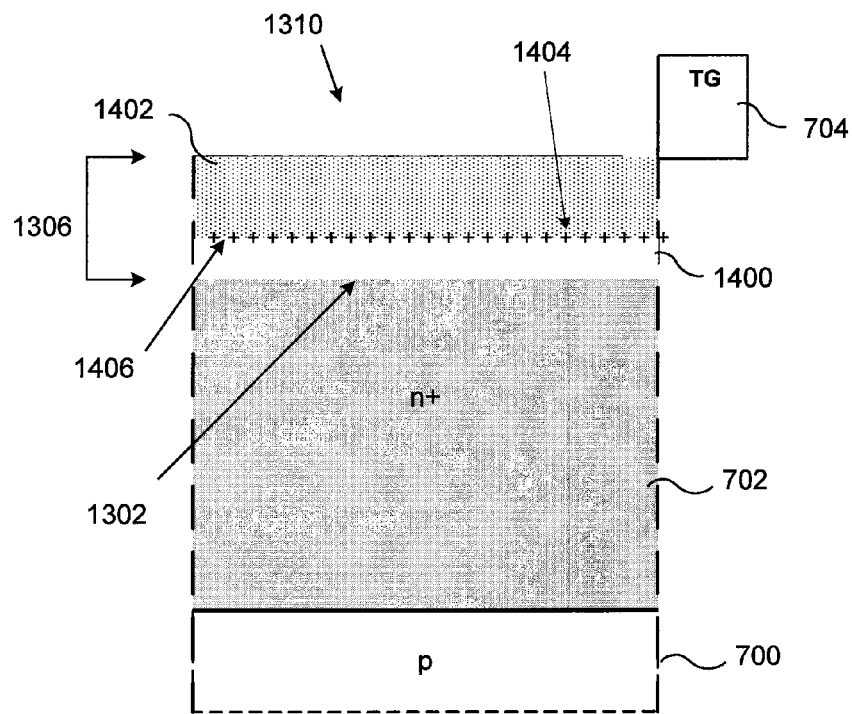
FIG. 14 illustrates an enlarged view of area 1310 shown in FIG. 13.

FIG. 14 illustrates an enlarged view of area 1310 shown in FIG. 13. Dielectric structure 1306 includes a thin gate oxide layer 1400 that covers the surface of n+ pinning layer 702 and n-type silicon semiconductor layer 706 and a thicker silicon nitride layer 1402 disposed over the thinner gate oxide layer 1400. Positive fixed charge 1404 is shown at the interface 1406 between gate oxide layer 1400 and silicon nitride layer 1402.

Thin gate oxide layer 1400 and silicon nitride layer 1402 both extend under transfer gate 704 in the illustrated embodiment. In another embodiment in accordance with the invention, silicon nitride layer 1402 does not extend under transfer gate 704.

The oxide-nitride interface 1406 contains and retains positive fixed charge 1404. The thickness of gate oxide layer 1400 is selected to optimize electron accumulation at interface 1302 (the interface between n-type pinning layer 702 and gate oxide layer 1400) by disposing the oxide-nitride interface 1406 as close as possible to interface 1302. The fixed positive charge 1404 creates an electric field that accumulates the silicon surface with electrons. Accumulating electrons at interface 1302 advantageously passivates the silicon surface to quench dark current generation at that location.

Figure 15:
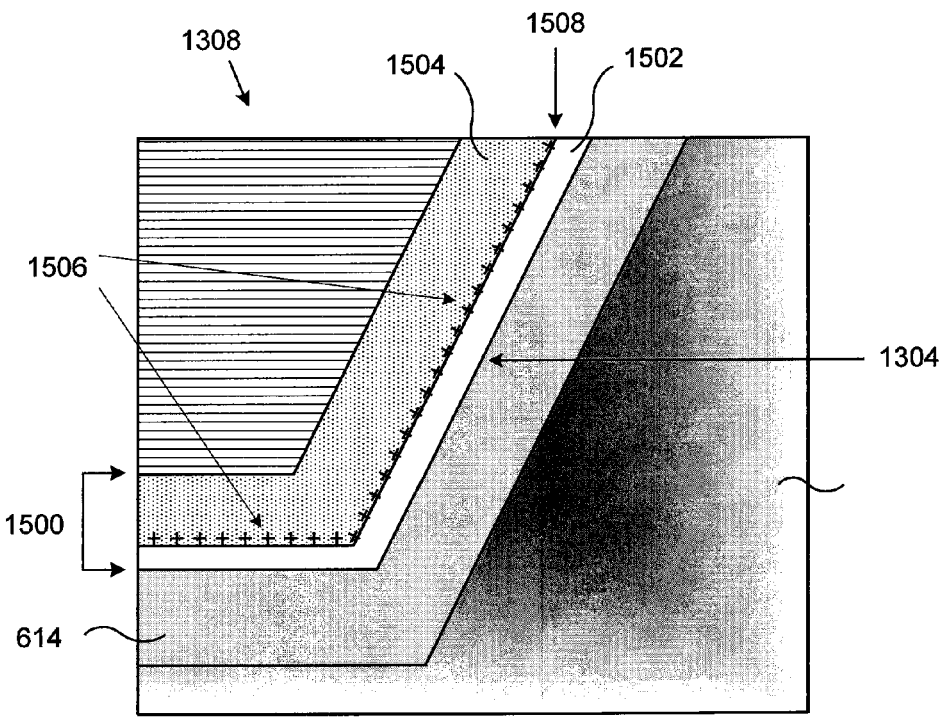
FIG. 15 depicts an enlarged view of area 1308 shown in FIG. 13.

FIG. 15 depicts an enlarged view of area 1308 shown in FIG. 13. Dielectric structure 1500 is disposed along an interior bottom and sidewalls of the trench. Dielectric structure 1500 includes a thin oxide liner layer 1502 and a silicon nitride layer 1504. The thin oxide liner layer 1502 is grown or deposited along the sidewalls and bottom surfaces of the trench. A thicker silicon nitride layer 1504 is then deposited over the oxide liner layer 1502. Silicon nitride layer 1504 is typically not the same silicon nitride layer as layer 1402 shown in FIG. 14. Positive fixed charge 1506 is shown at the interface 1508 between the oxide liner layer 1502 and silicon nitride layer 1504.

The fixed positive charge 1506 creates an electric field that accumulates the silicon interface 1304 (interface between n-type isolation layer 614 and oxide liner layer 1502) with electrons. Accumulating electrons at interface 1304 advantageously passivates the silicon surface to quench dark current generation at that location.

Figure 16:
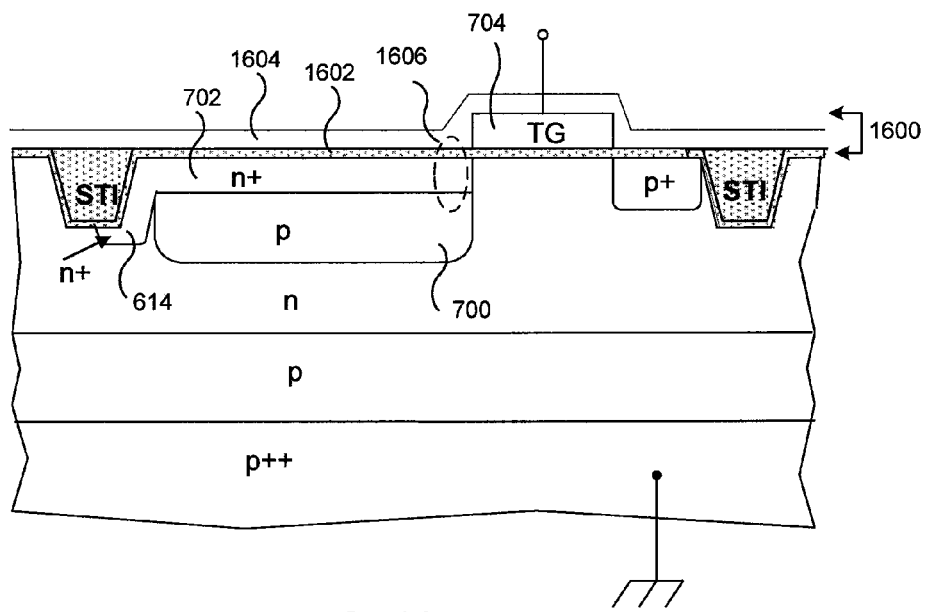
FIG. 16 depicts a cross-sectional schematic view of a fourth pixel structure in an embodiment in accordance with the invention.

FIG. 16 depicts a cross-sectional schematic view of a fourth pixel structure in an embodiment in accordance with the invention. The structure is similar to the structure shown in FIG. 13, but the layers that constitute the dielectric structure 1600 are formed differently. Gate oxide layer 1602 is formed prior to the formation of the gates, including the transfer gate 704. Thus, gate oxide layer 1602 is disposed under the transfer gate (TG) 704.

Silicon nitride layer 1604 is disposed over the pixel after the formation of the gates. Depositing the silicon nitride layer 1604 over the pixel after gate formation has a benefit of not affecting the electrical parameters of the FETs in the pixel. Additionally, the type of the material in silicon nitride layer or the deposition method for the silicon nitride layer can be selected to increase or maximize the amount of positive fixed charge. For example, one type of material used for silicon nitride layer that can maximize the positive fixed charge is an ultraviolet "UV" nitride material. One example of a UV nitride material is described in an article by Chung-Wei Chang, et al., entitled "High Sensitivity of Dielectric Films Structure for Advanced CMOS Image Sensor Technology".

Figure 17:
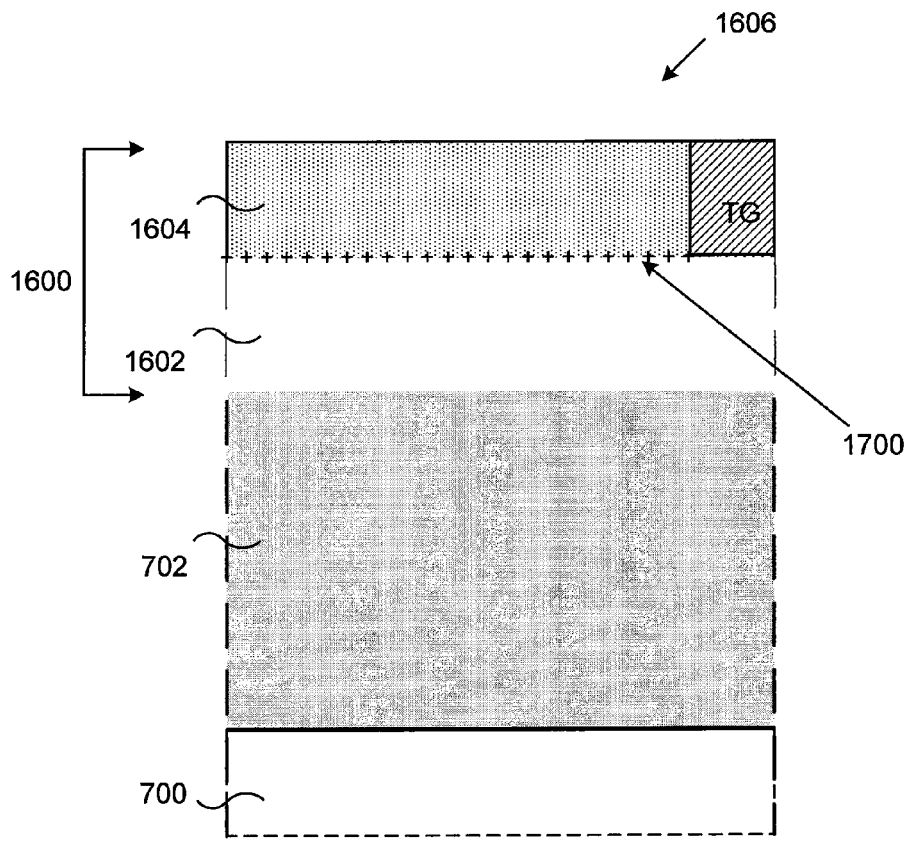
FIG. 17 illustrates an enlarged view of area 1606 shown in FIG. 16.

FIG. 17 illustrates an enlarged view of area 1606 shown in FIG. 16. The dielectric structure 1600 includes a gate oxide layer 1602 disposed over the surface of pinning layer 702 and silicon semiconductor layer 706 and a silicon nitride layer 1604 disposed over portions of gate oxide layer 1602. As discussed earlier, gate oxide layer 1602 is formed over the surface of the pixel before the gates are formed. The silicon nitride layer 1604 is disposed over the exposed portions of the gate oxide layer 1602 and the gates after the gates are formed. Positive fixed charge 1700 is shown at the interface between gate oxide layer 1602 and silicon nitride layer 1604.

Referring now to FIGS. 18A-18F, there is shown a method for producing STI regions 1309, 1311 and isolation layer 614 shown in FIG. 13 in an embodiment in accordance with the invention. The processes shown in FIGS. 18A-18F are not meant to illustrate all of the fabrication techniques for an image sensor or for a pixel. Those skilled in the art will recognize that other processes may be implemented prior to, in between, and subsequent to the procedures shown in FIGS. 18A-18F.

Figure 18A:
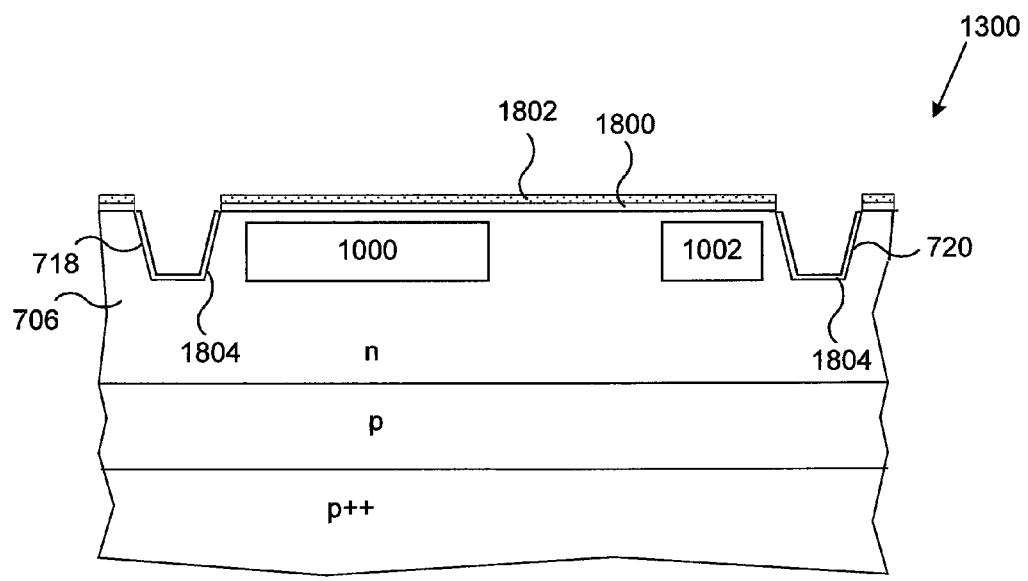
FIGS. 18A-18F depict a method for producing the STI regions 1309, 1311 and isolation layer 614 shown in FIG. 13 in an embodiment in accordance with the invention.

FIG. 18A illustrates the pixel after n-type silicon semiconductor layer 706 is formed in or over p-type epitaxial layer 710, a pad oxide layer 1800 is grown over the surface of silicon semiconductor layer 706, and a nitride layer 1802 is deposited over pad oxide layer 1800. Trenches 718, 720 have also been formed in silicon semiconductor layer 706. Box 1000 represents an area in silicon semiconductor layer 706 where a photodetector will subsequently be formed. Box 1002 represents an area in silicon semiconductor layer 706 where a charge-to-voltage conversion region will subsequently be formed.

Oxide liner layer 1804 is grown along the interior surfaces of trenches 718, 720. An optional nitride pull-back can be performed prior to the formation of oxide liner layer 1804. The nitride pull-back involves etching back a portion of nitride layer 1802 to expose the corners of trenches 718, 720 for rounding purposes when oxide liner layer 1804 is grown in trenches 718, 720.

Figure 18B:
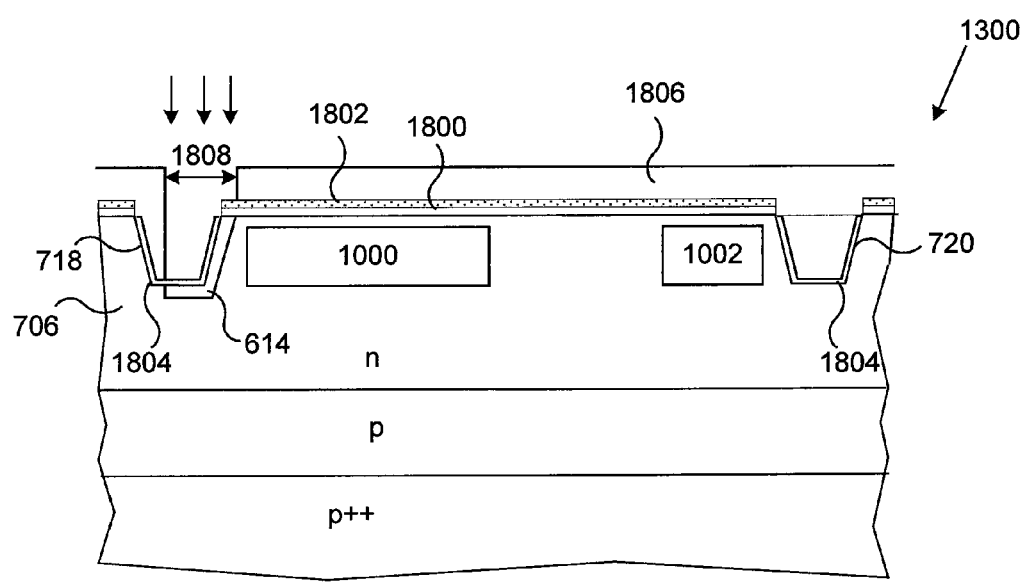

A masking layer 1806 is then formed over pixel 1300 and patterned to produce opening 1808 (FIG. 18B). Opening 1808 is formed only over trench 718 while trench 720 is covered by masking layer 1806. An n-type dopant is then implanted into opening 1808 through a portion of oxide liner layer 1804, a portion of nitride layer 1802, and a portion of pad oxide layer 1800 (as represented by the arrows). The implanted dopants form n-type isolation layer 614 along an exterior portion of the bottom of trench 718 and the exterior sidewall of trench 718 immediately adjacent to box 1000.

Figure 18C:
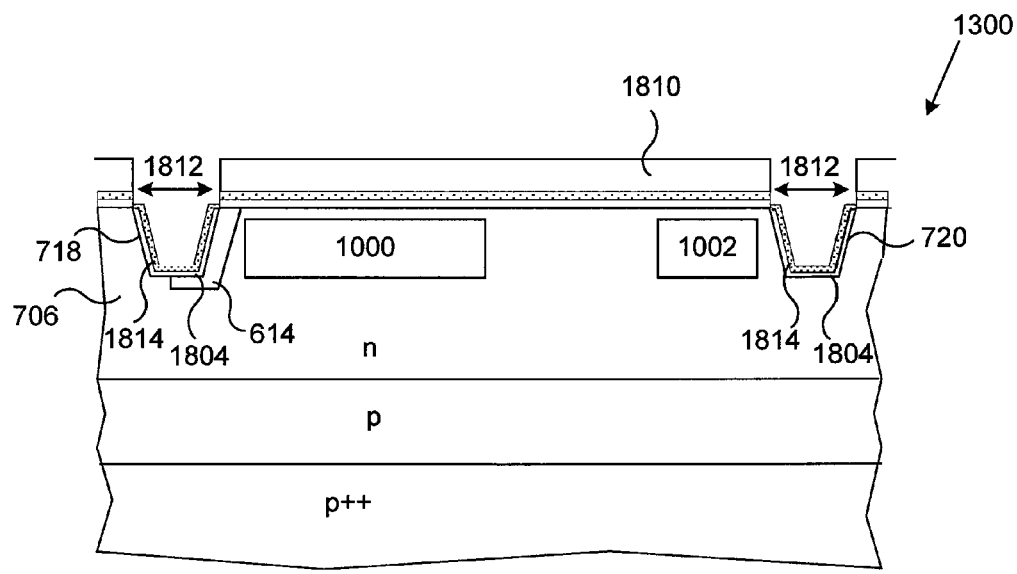

Masking layer 1806 is then removed and another masking layer 1810 is formed over pixel 1300 and patterned to produce openings 1812 (FIG. 18C). A silicon nitride material is deposited into openings 1812 to form silicon nitride layer 1814. Oxide liner layer 1804 and silicon nitride layer 1814 form a dielectric structure that is disposed along the interior bottoms and sidewalls of trenches 718, 720. As described in conjunction with FIG. 15, the interface between oxide liner layer 1804 and silicon nitride layer 1814 contains and retains positive fixed charge.

After formation of silicon nitride layer 1814, an optional low energy implant of an n-type dopant into trenches 718, 720 can then be performed to passivate the silicon-silicon dioxide interface. This procedure is not shown in a figure.

Figure 18D:
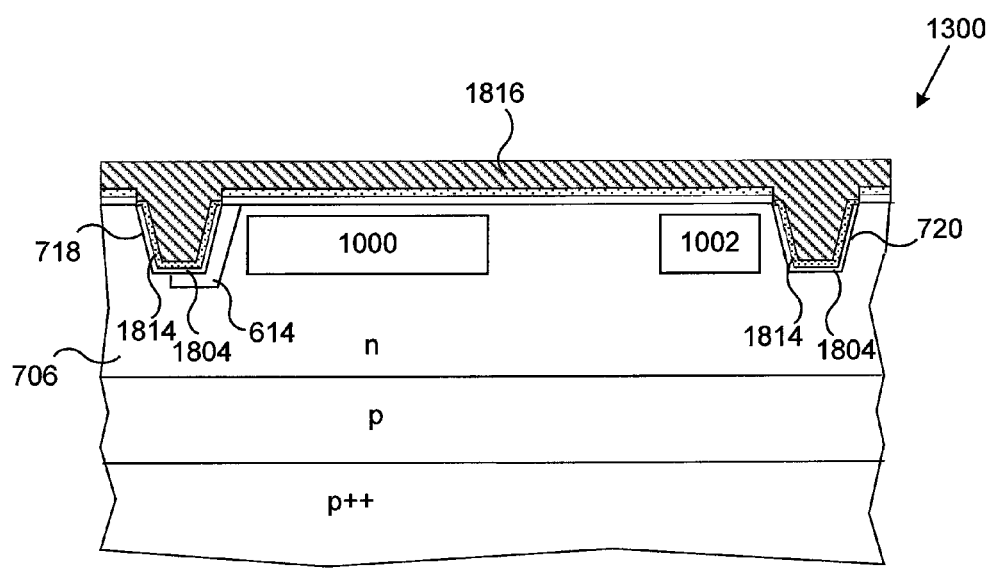
Figure 18E:
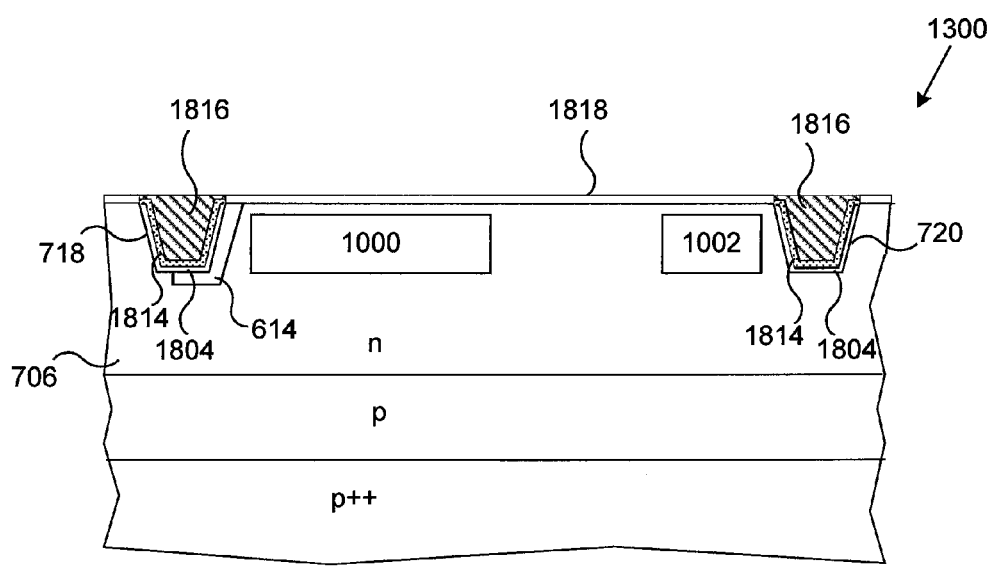
Figure 18F:
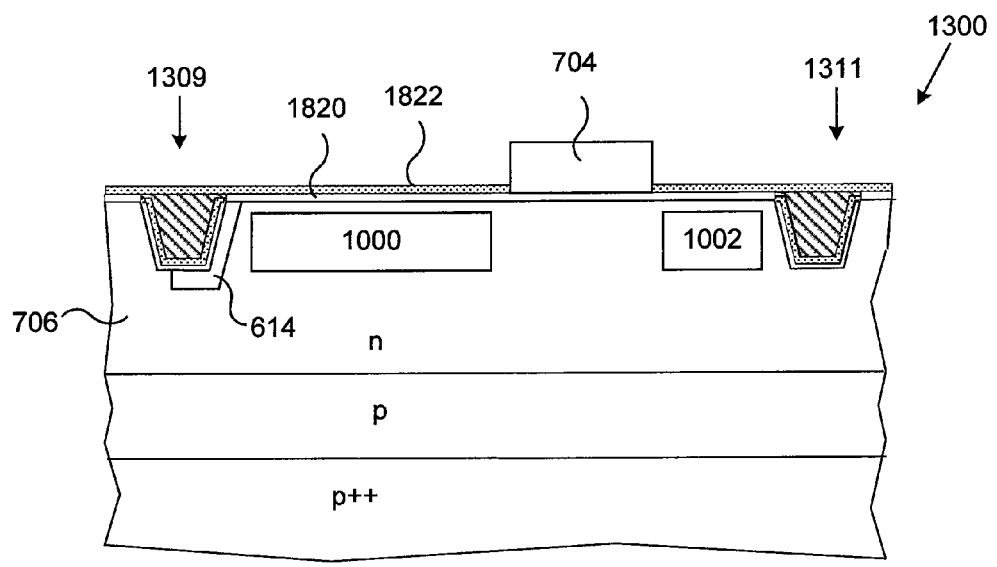

Next, as shown in FIG. 18D, masking layer 1810 is removed and a dielectric material 1816 formed over the surface of n-type silicon semiconductor layer 706. Dielectric material 1816 fills trenches 718, 720. The dielectric material 1816 is then removed from the surface of silicon semiconductor layer 706 until the dielectric material 1816 only fills trenches 718, 720 (see FIG. 18D). The upper surface of dielectric material 1816 is substantially planar with the upper surface of silicon semiconductor layer 706. Typically, pad oxide layer 1800 and nitride layer 1802 are also removed and an oxide layer 1818 is formed over the surface of silicon semiconductor layer 706.

Typically, oxide layer 1818 is also removed in a separate process and a thin gate oxide layer 1820 is formed over the surface of silicon semiconductor layer 706. Transfer gate 704 is formed on the surface of gate oxide layer 1820, followed by deposition of silicon nitride layer 1822. Silicon nitride layer 1822 and gate oxide layer 1820 form a dielectric structure, such as the structure depicted in FIG. 14. And as described in conjunction with FIG. 14, the interface between gate oxide layer 1820 and silicon nitride layer 1822 contains and retains positive fixed charge.

Figure 19:
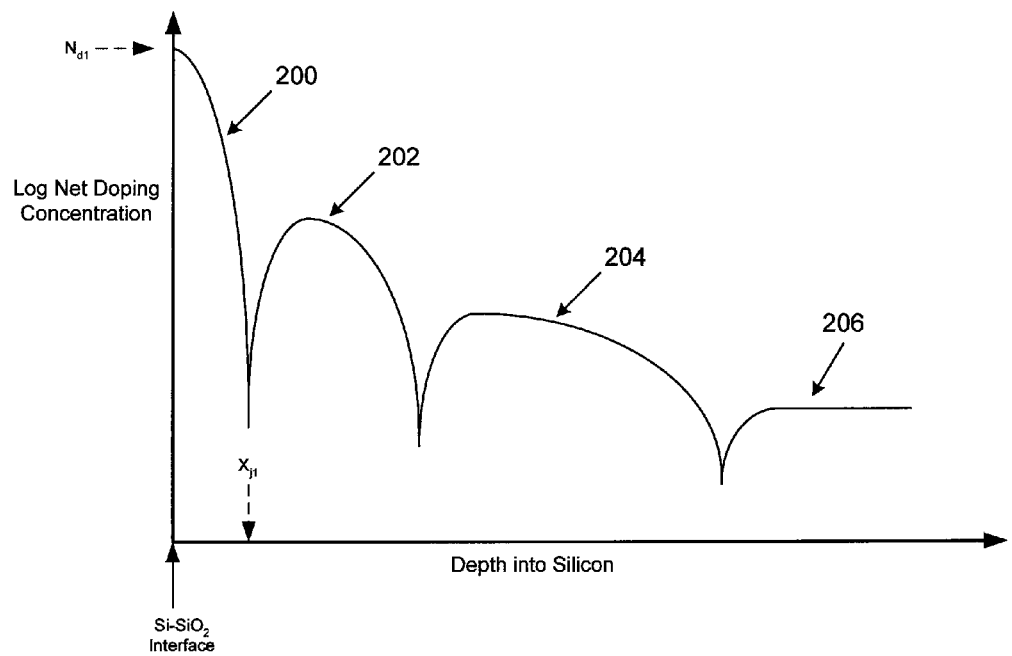
FIG. 19 depicts a log net doping concentration versus depth diagram along line E-E' in FIG. 2.

Referring now to FIG. 19, there is shown a log net doping concentration versus depth diagram along line E-E' in FIG. 2. The value $N_{d1}$ is the peak doping concentration of pinning layer 200 at the silicon surface. $X_{j1}$ is the junction depth of the n+ pinning layer 200.

Figure 20:
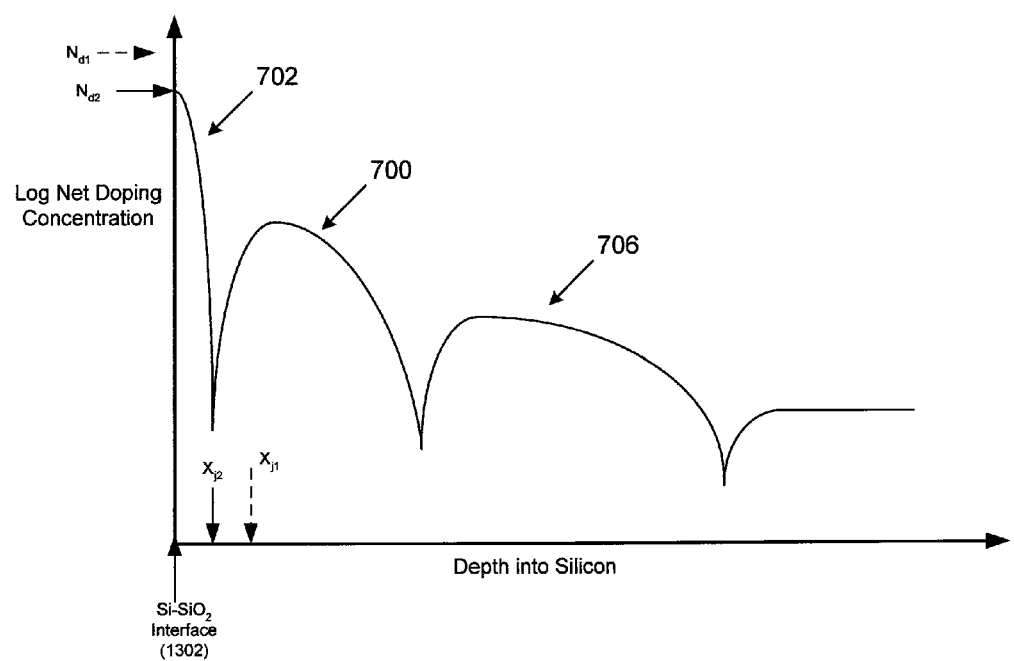
FIG. 20 illustrates a log net doping concentration versus depth diagram along line F-F' in FIG. 13.

FIG. 20 illustrates an exemplary log net doping concentration versus depth diagram along line F-F' in FIG. 13. The value $N_{d2}$ is the peak doping concentration of pinning layer 702 at the silicon surface. $X_{j2}$ is the junction depth of the n+ pinning layer 702. The peak doping level and the junction depths in FIG. 20 are less than the peak doping level and the junction depths shown in FIG. 19. The lower values in FIG. 20 are due to the fixed positive charge incorporated in the dielectric stack above the silicon surface. A reduced peak doping level and lower junction depths provide improved quantum efficiency for short wavelength light.

Figure 21:
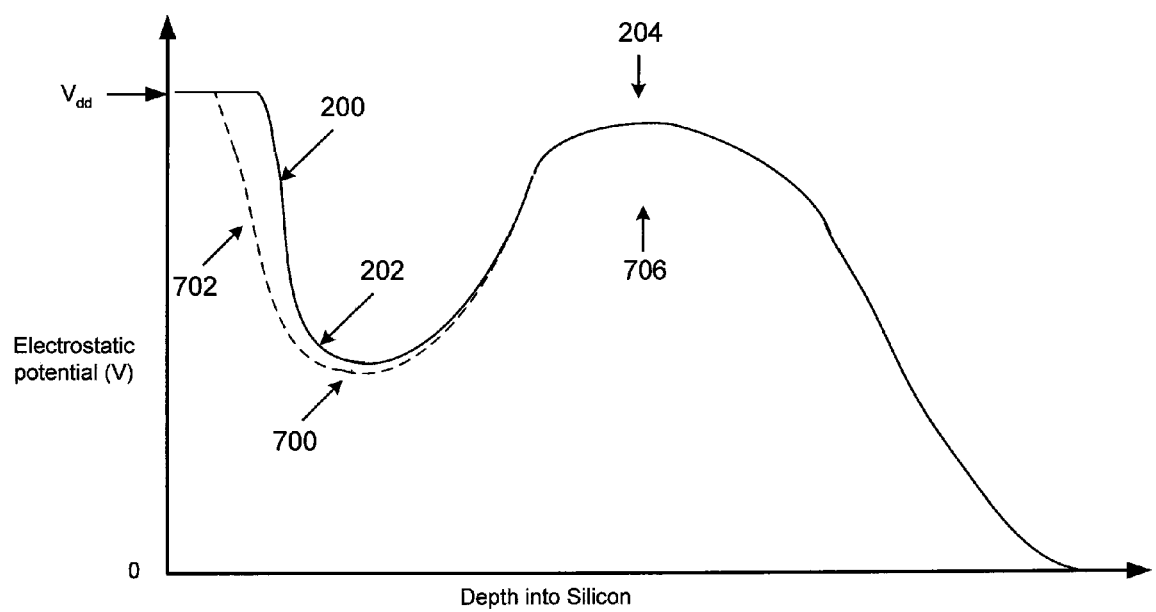
FIG. 21 depicts an electrostatic potential versus depth through the lines E-E' in FIG. 2 and line F-F' in FIG. 13.

Referring now to FIG. 21, there is shown an electrostatic potential versus depth through the lines E-E' in FIG. 2 and line F-F' in FIG. 13. The depletion region associated with the surface junction of pinning layer 702 and storage region 700 is closer to the silicon surface compared to the prior art pinning layer 200 and storage region 202. This is due to the fixed positive charge incorporated in the dielectric stack above the silicon surface. Having the depletion region associated with the surface junction of pinning layer 702 and storage region 700 closer to the silicon surface provides improved quantum efficiency for short wavelength light.

The invention has been described in detail with particular reference to certain preferred embodiments thereof, but it will be understood that variations and modifications can be effected within the spirit and scope of the invention. For example, the features of pixel 600, 1300 have been described with reference to particular conductivity types. Opposite conductivity types can be used in other embodiments in accordance with the invention. Additionally, some of the features illustrated in pixel 600, 1300 can be omitted or shared in other embodiments in accordance with the invention. For example, pinning layer 702 does not have to be included in the pixels. Amplifier transistor (SF) or charge-to-voltage conversion region 106 can be shared by two or more pixels in other embodiments in accordance with the invention.

And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 pixel
102 photodetector
104 contact
106 charge-to-voltage conversion region
108 contact
110 gate of source follower transistor
111 signal line
112 contact
114 isolation layer
200 pinning layer
202 storage region
204 layer
206 substrate layer
208 shallow trench isolation
210 dielectric material
400 image capture device
402 light
404 imaging stage
406 image sensor
408 processor
410 memory
412 display
414 other input/output (I/O)
500 image sensor
502 pixel
504 imaging area
506 column decoder
508 row decoder
510 digital logic
512 analog or digital output circuits
600 two adjacent pixels
602 photodetector
604 contact
606 charge-to-voltage conversion region
608 contact
610 gate of amplifier transistor
612 contact
614 isolation layer
700 storage region
702 pinning layer
704 transfer gate
706 silicon semiconductor layer
708 substrate layer
710 epitaxial layer
712 substrate
714 shallow trench isolation
716 shallow trench isolation
718 trench
720 trench
722 dielectric material
1000 area where photodetector will be formed
1002 area where charge-to-voltage conversion region will be formed
1004 masking layer
1006 opening
1008 masking layer
1010 opening
1100 masking layer
1102 opening
1200 well
1300 pixel
1302 silicon-silicon dioxide interface
1304 silicon-silicon dioxide interface
1306 dielectric structure
1308 area to be enlarged
1309 STI region
1310 area to be enlarged
1311 STI region
1400 gate oxide layer
1402 silicon nitride layer
1404 fixed positive charge
1406 interface
1500 dielectric structure
1502 oxide liner layer
1504 silicon nitride layer
1506 fixed positive charge
1508 interface
1600 dielectric structure
1602 gate oxide layer
1604 silicon nitride layer
1606 area to be enlarged
1700 fixed positive charge
1800 pad oxide layer
1802 nitride layer
1804 liner oxide layer
1806 masking layer
1808 opening
1810 silicon nitride layer
1812 dielectric material
1814 nitride layer
1816 masking layer
1818 opening
1820 gate oxide layer
1822 silicon nitride layer
RG reset gate
RS row select transistor
SF amplifier transistor
STI shallow trench isolation
TG transfer gate
VDD voltage supply
VOUT output

The invention claimed is:

1. An image sensor comprising an imaging area having a plurality of pixels with at least one pixel comprising:
   a photodetector including a storage region having a p conductivity type disposed in a silicon semiconductor layer having an n conductivity type;
   a first shallow trench isolation region disposed in the silicon semiconductor layer laterally adjacent to the storage region, wherein the first shallow trench isolation region comprises a trench formed in the silicon semiconductor layer that includes a first dielectric structure disposed along an interior bottom and sidewalls of the trench, wherein the dielectric structure includes a first silicon nitride layer disposed over an oxide liner layer;

an isolation layer having the n conductivity type disposed in the silicon semiconductor layer only partially along an exterior bottom and sidewall of the trench immediately adjacent to the storage region;

a pinning layer having the n conductivity type disposed over the storage region and connected to the isolation layer;

a dielectric structure disposed over the pinning layer and at least a portion of the silicon semiconductor layer, wherein the dielectric structure includes a gate oxide layer disposed over the pinning layer and the silicon semiconductor layer and a silicon nitride layer disposed over at least a portion of the gate oxide layer, wherein the silicon nitride layer extends under a transfer gate positioned between the photodetector and the charge-to-voltage conversion region.

2. The image sensor as in claim 1, further comprising a charge-to-voltage conversion region having the p conductivity type disposed in the silicon semiconductor layer and a transfer gate disposed between the storage region and the charge-to-voltage conversion region.

3. The image sensor as in claim 1, wherein the image sensor is disposed in an image capture device.

4. The image sensor as in claim 2, further comprising a second shallow trench isolation region disposed in the silicon semiconductor layer laterally adjacent to the charge-to-voltage conversion region, wherein the second shallow trench isolation region includes a second dielectric structure disposed along an interior bottom and sidewalls of the trench, wherein the dielectric structure includes a second silicon nitride layer disposed over a gate oxide layer.

5. The image sensor as in claim 2, further comprising a well having an n conductivity type disposed in the silicon semiconductor layer laterally adjacent to the charge-to-voltage conversion region.

6. An image sensor comprising an imaging area having a plurality of pixels with at least one pixel comprising:

a photodetector including a storage region having a p conductivity type disposed in a silicon semiconductor layer having an n conductivity type;

a charge-to-voltage conversion region having the p conductivity type disposed in the silicon semiconductor layer;

a transfer gate disposed between the photodetector and the charge-to-voltage conversion region;

a first shallow trench isolation region disposed in the silicon semiconductor layer laterally adjacent to the photodetector, wherein the first shallow trench isolation region comprises a trench formed in the layer that includes a first dielectric structure disposed along an interior bottom and sidewalls of the trench, wherein the first dielectric structure includes a first silicon nitride layer disposed over an oxide liner layer;

an isolation layer having the n conductivity type disposed in the silicon semiconductor layer only partially along an exterior bottom and along a sidewall of the trench immediately adjacent to the storage region;

a second shallow trench isolation region disposed in the silicon semiconductor layer laterally adjacent to the charge-to-voltage conversion region, wherein the second shallow trench isolation region comprises a trench formed in the silicon semiconductor layer that includes a second dielectric structure disposed along an interior bottom and sidewalls of the trench, wherein the second dielectric structure includes a second silicon nitride layer disposed over a gate oxide layer;

a pinning layer having the n conductivity type disposed over the storage region and connected to the isolation layer; and a dielectric structure disposed over the pinning layer and at least a portion of the silicon semiconductor layer, wherein the dielectric structure includes a gate oxide layer disposed over the pinning layer and the silicon semiconductor layer and a silicon nitride layer disposed over at least a portion of the gate oxide layer, wherein the silicon nitride layer extends under the transfer gate.

* * * * *